United States Patent
Belet

(10) Patent No.: US 10,924,016 B2
(45) Date of Patent: Feb. 16, 2021

(54) METHOD FOR CONVERTING ELECTRIC ENERGY BETWEEN C-TYPE USB DEVICES AND CORRESPONDING DEVICE

(71) Applicant: STMicroelectronics (Grand Ouest) SAS, Delarue (FR)

(72) Inventor: Christophe Belet, Parigné l'évêque (FR)

(73) Assignee: STMICROELECTRONICS (GRAND OUEST) SAS, Delarue (FR)

( * ) Notice: Subject to any disclaimer, the term of this patent is extended or adjusted under 35 U.S.C. 154(b) by 192 days.

(21) Appl. No.: 16/160,446

(22) Filed: Oct. 15, 2018

(65) Prior Publication Data
US 2019/0115833 A1 Apr. 18, 2019

(30) Foreign Application Priority Data
Oct. 16, 2017 (FR) ..................................... 17 59677

(51) Int. Cl.
| H02J 7/00 | (2006.01) |
| H02M 1/32 | (2007.01) |
| H02M 1/00 | (2006.01) |
| H02M 3/158 | (2006.01) |
| G01R 31/40 | (2020.01) |

(52) U.S. Cl.
CPC ............ *H02M 3/158* (2013.01); *G01R 31/40* (2013.01); *H02J 7/0068* (2013.01); *H02M 3/1582* (2013.01); *H02M 1/32* (2013.01); *H02M 2001/0009* (2013.01)

(58) Field of Classification Search
CPC ...... H02M 3/158; H02M 3/1582; H02M 1/32; H02M 2001/0009; G01R 31/40; H02J 7/0068
USPC .......................................................... 307/20
See application file for complete search history.

(56) References Cited

U.S. PATENT DOCUMENTS

| 10,250,059 B2 * | 4/2019 | Aldehayyat ......... H02M 3/1582 |
| 2016/0261128 A1 | 9/2016 | Johnston et al. |
| 2017/0222546 A1 | 8/2017 | Netsu |
| 2017/0279284 A1 | 9/2017 | Lim et al. |

* cited by examiner

*Primary Examiner* — Hal Kaplan
(74) *Attorney, Agent, or Firm* — Slater Matsil, LLP

(57) ABSTRACT

A USB Type-C device supporting a bidirectional power supply, includes: a first device terminal configured to be coupled to a second USB Type-C device; a second device terminal configured to be coupled to a rechargeable DC voltage power source; and a reversible switched-mode power supply coupled to the first device terminal and the second device terminal.

19 Claims, 3 Drawing Sheets

METHOD FOR CONVERTING ELECTRIC ENERGY BETWEEN C-TYPE USB DEVICES AND CORRESPONDING DEVICE

CROSS-REFERENCE TO RELATED APPLICATIONS

This application claims priority to French Patent Application No. 1759677, filed on Oct. 16, 2017, which application is hereby incorporated herein by reference.

TECHNICAL FIELD

This disclosure relates generally to universal serial bus (USB) devices, and in particular embodiments to a method for converting electrical energy between C-type USB devices and a corresponding device.

BACKGROUND

Theoretically, USB Type-C devices supporting the USB power delivery (PD) mode allow up to 100 W of power to be delivered with a maximum voltage of 20 V and a maximum current of 5 A. The power to be delivered between two USB 3.1 PD Type-C devices is negotiable via specific controllers and the electrical power supply may advantageously be bidirectional between various USB 3.1 Type-C devices.

A first USB PD Type-C device supporting a dual-role power (DRP) bidirectional electrical power supply both delivers electrical power to a second USB PD Type-C device supporting a DRP bidirectional electrical power supply operating in "receiver" mode and receives electrical power delivered by the second device operating in "source" mode over one and the same power supply line, and in voltage regulation mode or in current regulation/limitation mode, or in voltage/current regulation mode, as necessary according to the type of source and receiver devices. This last mode may be combined with the USB PPS (programmable power supply) standard.

A USB Type-C cable is generally designed to be coupled and establish a power supply and communication line between a first USB PD Type-C device and a second USB PD Type-C device.

For example, in a first application, the first device operating in source mode includes a 3.6 volt battery and supplies power to a second device operating in receiver mode including a mobile phone under a voltage of 5 volts.

In a second application, the first device operating in receiver mode includes a portable computer including a battery of 20 volts and is supplied with power by the second device operating in source mode under a voltage of 12 volts in order to recharge its battery of 17 volts.

FIG. 1 schematically illustrates an example of a USB PD Type-C system SYS1 known from the prior art.

The system SYS1 includes a USB Type-C device DS1 coupled to a second USB Type-C device DR via a USB Type-C cable CBL.

The device DS1 and the device DR each include at least one channel configuration pin CC1, at least one output supply voltage pin VBUS1 and at least one ground pin GND, the pins of the same nature being linked to one another by the cable CBL and forming a control line, a power supply line and a common ground line, respectively.

The device DS1 includes an electrical energy converter CONV and a DC voltage reversible electrical power source BATT, for example a battery. Stated otherwise, the source BATT may deliver or store electrical power.

The electrical power source BATT includes a connection terminal BBATT.

The converter CONV includes a connection terminal BCONV1 that is linked to the pin VBUS1, a connection terminal Ec that is linked to the pin CC1 and a connection terminal BCONV2 that is linked to the terminal BBATT.

The electrical energy converter CONV additionally includes a power supply controller 1, one input E11 of which is linked to the terminal Ec, one output S14 of which is linked to an input Ec4 of a switching device 4, and two outputs S12 and S13 of which are linked to voltage step-up (boost) or step-down (buck) chopper electrical energy conversion devices 2 and 3, respectively, which generally include MOS power transistors and diodes that are connected in antiparallel to the transistors.

The device 2 includes an input E2 that is linked to the terminal BCONV2 and an output S2 that is linked to an input E42 of the switching device 4. The device 2 known from the prior art is configured such that the flow of electrical power is transferred from the input E2 to the output S2.

The device 3 includes an output S3 that is linked to the terminal BCONV2 and an input E3 that is linked to an output S43 of the switching device 4. The device 3 known from the prior art is configured such that the flow of electrical power is transferred from the input E3 to the output S3.

The switching device 4 additionally includes a connection terminal B4 that is linked to the terminal BCONV1.

The device 4 is configured such that according to the signal $S\_EC_4$ received at the terminal Ec4 and transmitted by the controller 1, the input E42 or the output S43 is linked to the terminal B4. It prevents a reverse voltage being formed across the terminals of the antiparallel diodes of the electrical energy conversion device when it is not in use by disconnecting it from the power supply line.

When the device DR operates in receiver mode requiring a power supply, a dialogue is established between the receiver device DR and the source device DS1 through the channel configuration pin CC1. This is a negotiation phase.

The device DR transmits the new value of the power supply to the power supply controller 1, then the device DS1 operating in source mode transmits a confirmation to the device DR.

Upon completion of the negotiation phase, the power supply controller 1 transmits a signal S_Ec4 to the device 4 such that the input E42 is linked to the terminal B4, and drives the device 2 such that the electrical power stored in the battery BATT supplies power to the device DR via the pin VBUS1 according to the voltage and/or current value required by the device DR through the pin CC1.

When the device DR operating in source mode delivers a power supply to the device DS1 operating in receiver mode, a negotiation phase is initiated beforehand, as described above. A dialogue is established between the device DR and the device DS1 via the channel configuration pin CC1.

The device DR transmits the value of the power supply to the power supply controller 1, then the device DS1 acknowledges receipt.

Upon completion of the negotiation phase, the power supply controller 1 transmits a signal S_Ec4 to the device 4 such that the output S43 is linked to the terminal B4, and drives the device 3 such that the electrical power delivered by the device DR is stored in the battery BATT.

However, the electrical energy converters known from the prior art have multiple drawbacks.

The majority of the energy conversion devices known from the prior art include MOS power transistors, which are not capable of reversing the power exchange flow between their input and output.

Consequently, it is necessary to use two converters operating in complement to one another. Stated otherwise, a first device is configured to recharge a power source that is incorporated within the source device and a second device is configured to discharge the power source.

These two operating modes require an additional switching device making it possible to activate one or the other of the two energy conversion devices.

Moreover, the majority of energy conversion devices deliver a fixed voltage. The output voltage of the devices is not adjustable and they are not capable of regulating a current.

There is a need for an electrical energy converter having a simplified architecture delivering an adjustable voltage and providing voltage and/or current regulation.

SUMMARY

According to modes of implementation and embodiments, the incorporation of a reversible switched-mode power supply within a USB Type-C source device, and the regulation of the transmitted energy, is advantageously proposed.

According to one aspect, a USB DRP Type-C device, i.e. a device supporting a bidirectional power supply, is proposed, which device includes a first terminal that is intended or configured to be coupled to a second USB Type-C device, a second terminal that is intended or configured to be coupled to a rechargeable DC voltage power source, and a reversible switched-mode power supply that is coupled to the two terminals.

The reversible switched-mode power supply may be a voltage step-up or voltage step-down power supply.

According to one embodiment, the reversible switched-mode power supply includes an inductor and four switching cells, the switching cells being placed symmetrically with respect to the inductor.

The symmetrical arrangement of the switching cells with respect to the inductor ensures the reversibility of the power transfer in the reversible switched-mode power supply.

Advantageously, the reversible switched-mode power supply includes a capacitor, a first terminal of which is linked to the first terminal and a second terminal of which is linked to a switching means that is configured to couple a second terminal of the capacitor to a common ground of the reversible switched-mode power supply.

The capacitance at the USB Type-C connection terminal is thus limited to 10 μF during the connection of the receiver device and the source device. The additional capacitor required for the reversible switched-mode power supply to operate is linked to the first terminal after connection between the two USB Type-C devices.

According to another embodiment, the device additionally includes voltage and current measurement circuit that are configured to measure the voltage and the current at each of the two terminals and a first circuit that is configured to regulate the exchange of power between the first and second terminals according to the results delivered by the measurement circuit.

Preferably, the first circuit is configured to detect malfunctions such as overvoltages, undervoltages, overloads or short circuits.

Devices for protecting the reversible switched-mode power supply are incorporated within the power supply. The design of the device is simplified.

Advantageously, the first circuit is configured to carry out regulation of a type chosen from current regulation and/or voltage regulation.

The reversible switched-mode power supply operates with regulation of a type chosen from current regulation and/or voltage regulation, unlike the devices of the prior art, which operate with fixed-voltage regulation. Moreover, the voltage and/or the current of the second terminal is monitored.

According to yet another embodiment, the first circuit includes a reversible switched-mode power supply regulating loop model including modifiable parameters, a storage medium that is configured to store, for each type of regulation, a set of reference parameters, and a substitution circuit that is configured to modify the parameters of the model according to the type of regulation implemented in the reversible switched-mode power supply.

The parameters of the regulating loop are adjusted according to the chosen type of regulation.

According to another aspect, a USB Type-C distributor device is proposed, which device supports a bidirectional power supply incorporating at least two USB Type-C devices supporting a bidirectional power supply such as defined above, in which a first terminal of a first device is intended to be coupled to a power source, a second terminal of the first device is coupled to a first terminal of the second device and a second terminal of the second device is intended to be coupled to a USB Type-C device supporting a bidirectional power supply.

According to yet another aspect, a method is proposed for managing the transfer of electrical energy between a first terminal of a first USB Type-C device supporting a bidirectional power supply that is coupled to a second USB Type-C device supporting a bidirectional power supply and a second terminal of the first USB Type-C device supporting a bidirectional power supply that is coupled to a rechargeable DC voltage power source, in which power is transferred between the two terminals in one direction or the other using one and the same channel.

Unlike the method described in the prior art including two power transfer channels, here only one channel is required.

According to one mode of implementation, the voltage and the current across said terminals is measured, and the exchange of power between the first and second terminals is regulated according to the result of the measurement.

Preferably, malfunctions such as overvoltages, undervoltages, overloads or short circuits are additionally detected according to the result of the measurement.

Advantageously, the regulation is of a type chosen from current regulation and/or voltage regulation.

Preferably, parameters of a reversible switched-mode power supply regulating loop are adjusted according to the type of regulation.

BRIEF DESCRIPTION OF THE DRAWINGS

Other advantages and features of the invention will become apparent upon examining the detailed description of completely non-limiting embodiments and the appended drawings, in which.

DETAILED DESCRIPTION OF ILLUSTRATIVE EMBODIMENTS

Modes of implementation and embodiments of the invention relate to universal serial bus (USB) devices, in particular the universal serial bus devices compatible with the USB 3.1 standard supporting the USB power delivery mode (PD mode) and including reversible connectors which do not impose any connection orientation, commonly known to those skilled in the art by the name C-Type, more particularly to the adjustment of the voltage on USB cables linking two USB devices.

Figure 1:
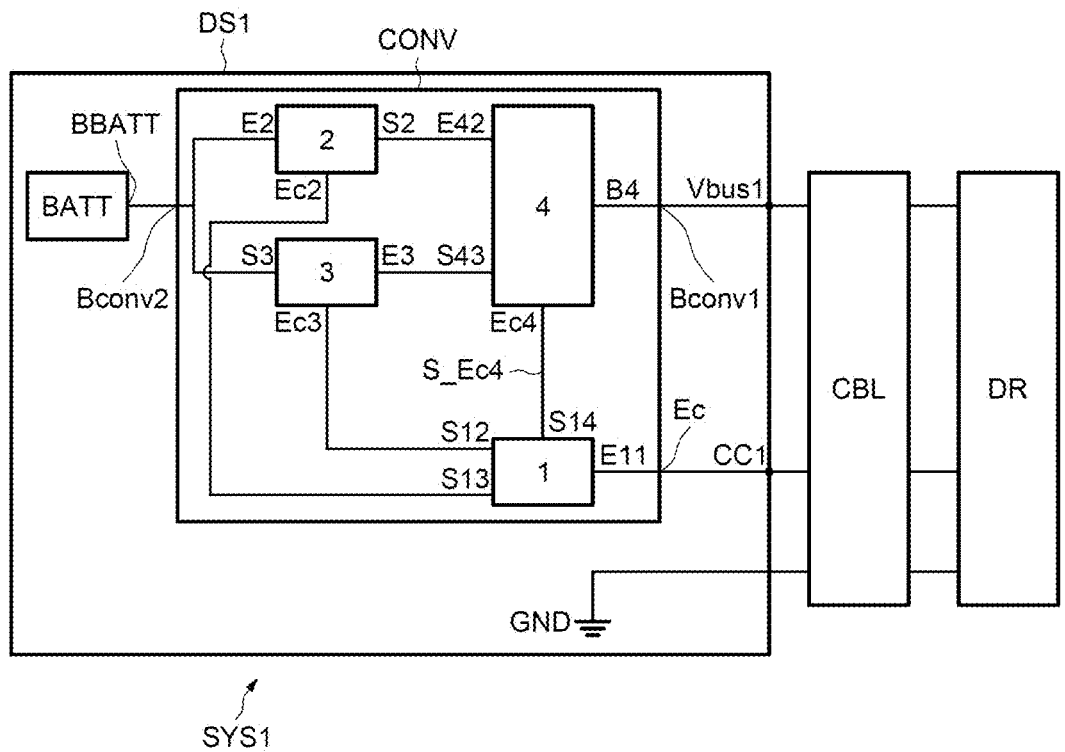
FIG. 1, described above, illustrates a USB Type-C system.
Figure 2:
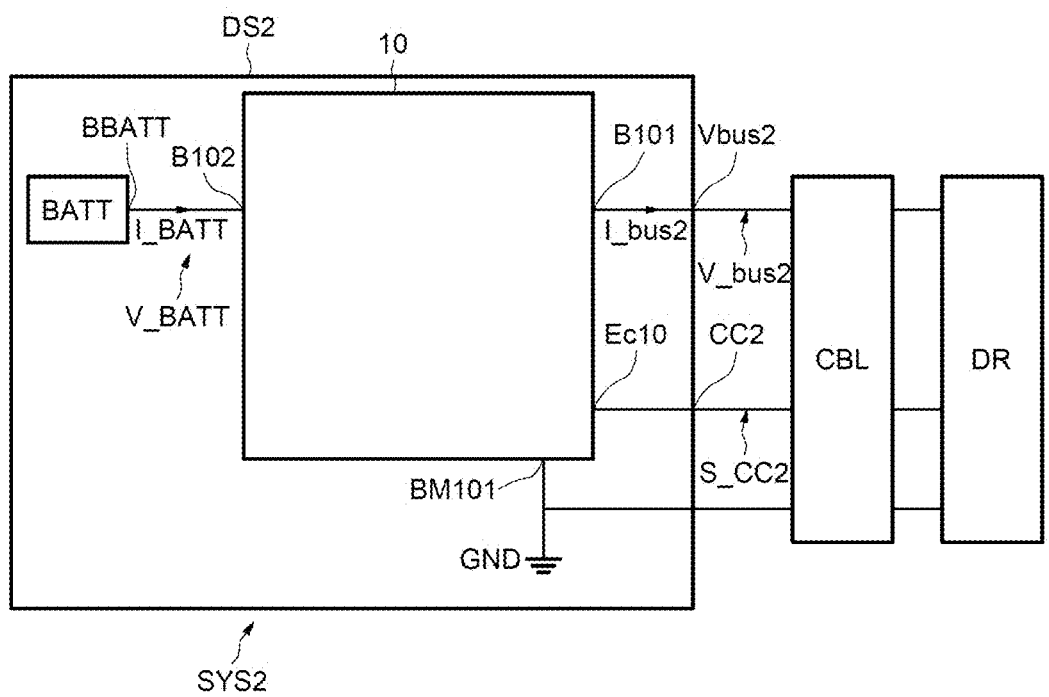
FIGS. 2 to 7 schematically illustrate various embodiments and modes of implementation of the invention.

Reference is made to FIG. 2 which shows an exemplary embodiment of a USB PD Type-C system SYS2.

The elements that are identical to those described above are denoted by the same numerical references.

The system SYS2 includes a first USB DRP Type-C device DS2, i.e. a device supporting a bidirectional power supply that is coupled to the second USB Type-C device DR supporting a bidirectional power supply via the USB Type-C cable CBL.

The device DS2 includes at least one channel configuration pin CC2, at least one supply voltage pin Vbus2 and at least one ground pin GND, the pins of the same nature being linked to the pins of the receiver device DR by the cable CBL, and forms a control line, a power supply line and a common ground line, respectively.

A signal S_CC2 flows through the channel configuration pin CC2.

The device DS2 additionally includes a rechargeable DC voltage power source BATT and a reversible switched-mode power supply 10.

The source BATT may be incorporated within the device DS2 as shown here or be located outside the device DS2 and linked to the device DS2 by a supply voltage pin.

The switched-mode power supply 10 includes a first connection terminal B101 that is linked to the pin Vbus2, a connection terminal Ec10 that is linked to the pin CC2, a connection terminal BM101 that is linked to the common ground GND and a second terminal B102 that is linked to the terminal BBATT of the source BATT.

A current I_BATT flows through the terminal BBATT under a voltage V_BATT.

A first terminal B101 is coupled to a USB Type-C receiver device DR, a second terminal B102 is coupled to a rechargeable DC voltage power source BAT, and a reversible switched-mode power supply 10 is connected between the two terminals.

As described above, the devices DR and DS2 are each able to operate in source mode or in receiver mode.

Figure 3:
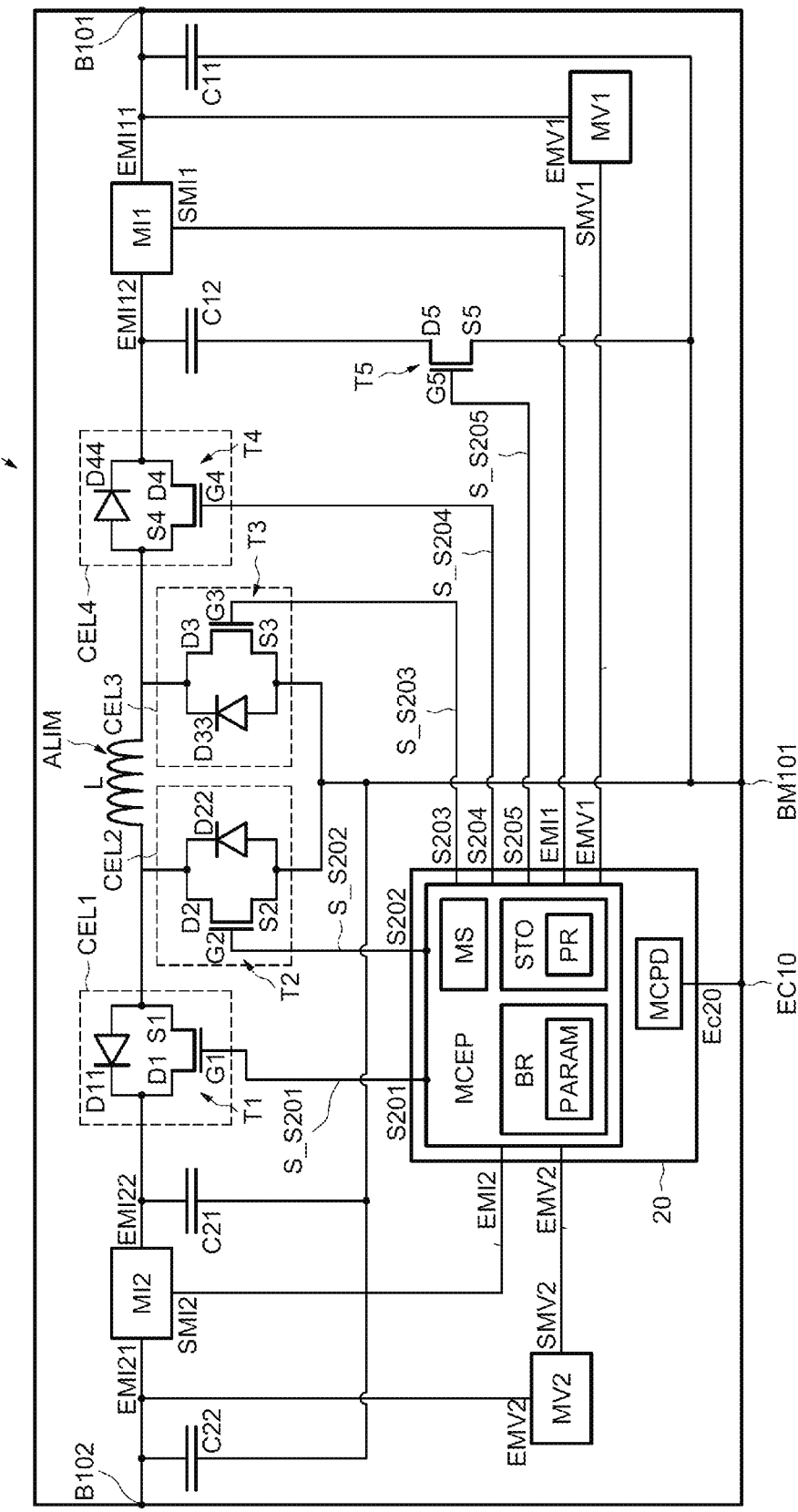

Reference is made to FIG. 3, which shows an exemplary embodiment of the reversible switched-mode power supply 10.

The reversible switched-mode power supply 10 includes a power supply controller 20 including an input Ec20 that is linked to the input Ec10, two inputs EMV1 and EMV2 that are linked to outputs SMV1 and SMV2, respectively, of voltage measurement circuits MV1 and MV2, two inputs EMI1 and EMI2 that are linked to outputs SMI1 and SMI2, respectively, of current measurement circuits MI1 and MI2 and outputs S201, S202, S203 and S204 that are linked to switching cells CEL1, CEL2, CEL3 and CEL4, respectively.

The voltage measurement circuits MV1 and MV2 (e.g. similar to those known in the art) are identical in make-up and additionally each include an input EMV1 and EMV2, respectively.

The current measurement circuits MI1 and MI2 (e.g. similar to those known in the art) are identical in make-up and additionally each include two inputs EMI11 and EMI12, and EMI21 and EMI22, respectively.

The switching cells CEL1, CEL2, CEL3 and CEL4 are identical in make-up and each include an NMOS transistor T1, T2, T3, T4 and a diode D11, D22, D33, D44 that is connected in antiparallel to the transistor, respectively, the anode of which is linked to the source S1, S2, S3, S4 of the transistor, respectively, and the cathode of which is linked to the drain D1, D2, D3, D4 of the transistor, respectively.

According to another embodiment, each switching cell includes an NMOS transistor including a diode connected in antiparallel to the transistor, the anode of which is linked to the source and the cathode of which is linked to the drain of the transistor, which diode is known to those skilled in the art as a "body diode".

The transistors T1, T2, T3 and T4 include a gate G1, G2, G3, G4 that is linked to the output S201, S202, S203, S204, respectively.

The reversible switched-mode power supply 10 includes a power supply pathway ALIM extending between the first terminal B101 and the second terminal B102. As will be seen in greater detail below, this pathway ALIM forms a channel allowing power to be transferred from one terminal to the other in one direction or the other.

The voltage measurement circuits MV and MV2 and the current measurement circuits MI1 and MI2 measure the voltage and the current at each of the two terminals B101 and B102 of the power supply pathway ALIM.

The power supply pathway ALIM includes the four switching cells CEL1, CEL2, CEL3 and CEL4, an inductor L and the circuits MI1 and MI2.

The input EMI11 of the circuit MI1 is linked to the terminal B101 and the input EMI12 is linked to the drain D4 of the cell CEL4. The source S4 of the cell CEL4 is linked both to a first terminal of the inductor L and to the drain D3 of the cell CEL3.

A second terminal of the inductor L is linked both to the drain D2 of the cell CEL2 and to the source S1 of the cell CEL1.

The drain D1 of the cell CEL1 is linked to the input EMI22 of the circuit MI2, and the input EMI21 is linked to the terminal B102.

The respective sources S2 and S3 of the cells CEL2 and CEL3 are linked to the terminal BM101.

The respective inputs EMV2 and EMV1 of the circuits MV1 and MV2 are linked to the terminals B101 and B102, respectively.

The circuits MI1 and MI2 are configured to measure the current between their respective inputs EMI11 and EMI12, and EMI21 and EMI22, i.e. the circuits MI1 and MI2 are configured to measure the current at each of the terminals B101 and B102. They include, for example, a resistor and an operational amplifier.

The circuits MV1 and MV2 are configured to measure the voltage at each of the two terminals B101 and B102, respectively. They include, for example, a voltage divider bridge.

The circuits MI1, MI2, MV1 and MV2 are generally known to those skilled in the art. The reversible switched-mode power supply 10 includes an inductor L and four switching cells CEL1, CEL2, CEL3 and CEL4, the switching cells being placed symmetrically with respect to the inductor.

A first terminal of a capacitor C11 is linked to the terminal B101 and a second terminal of the capacitor C11 is linked to the terminal BM101.

A first terminal of a capacitor C22 is linked to the terminal B102 and a second terminal of the capacitor C22 is linked to the terminal BM101.

According to the USB power delivery standard, the value of the capacitor connected to the terminal VBUS2 may not exceed 10 µF during the connection of the receiver device DR to the source device DS2 via the cable CBL. The capacitor C11 has, for example, a capacitance of 10 µF.

Since the power supply pathway ALIM is symmetrical with respect to the inductor L, the capacitance of the capacitors C11 and C22 is equal.

For the reversible switched-mode power supply 10 to operate satisfactorily, the maximum capacitance of the capacitor C11 as permitted by the USB power delivery standard is not sufficient.

The power supply pathway ALIM additionally includes capacitors C12 and C21.

A first terminal of the capacitor C12 is linked to the first terminal B101 and a second terminal is linked to a switching means T5 that is configured to couple a second terminal of the capacitor to a common ground GND of the reversible switched-mode power supply 10.

The switching means includes or is implemented by a transistor T5.

Stated otherwise, the first terminal of the capacitor C12 is linked to the drain D4 of the cell C4 and the second terminal of the capacitor C12 is linked to the drain D5 of the transistor T5. The gate G5 of the transistor T5 is linked to an output S205 of the controller 20 and the source S5 of the transistor T5 is linked to the terminal BM101.

A first terminal of the capacitor C21 is linked to the drain D1 of the cell C1 and a second terminal of the capacitor C21 is linked to the terminal BM101.

The capacitance of the capacitors C12 and C21 is equal.

Those skilled in the art will be able to determine the value of the capacitors C12, C21 and of the inductor L such that the reversible switched-mode power supply 10 operates satisfactorily. The value of the capacitors C12 and C21 is, for example, equal to 100 µF.

The power supply controller 20 includes a first circuit MCEP that is configured to regulate the exchange of power between the first and second terminals B101 and B102, respectively, according to the results delivered by the measurement circuits MV1, MV2, MI1 and MI2, and a second circuit MCPD that is configured to engage in dialogue with the receiver device DR during the negotiation phase in accordance with the USB power delivery standard.

The first circuit MCEP is configured to carry out regulation of a type chosen from current regulation and/or voltage regulation, and is linked to the inputs EMV1, EMV2, EMI1 and EMI2 and to the outputs S201, S202, S203, S204 and S205, and is configured to detect and handle malfunctions such as overvoltages, undervoltages, overloads or short circuits, known to those skilled in the art as overvoltage protection (OVP), UVLO: undervoltage lock up, OCP: overcurrent protection and SC: short circuit on the basis of the measurement circuits MV1, MV2, MI1 and MI2.

Stated otherwise, the first circuit MCEP is linked to the switching cells CEL1, CEL2, CEL3 and CEL4, and to the voltage measurement circuits MV1, MV2 and to the current measurement circuits MI1, MI2.

The circuit MCPD is linked to the input Ec20.

The circuit MCPD is, for example, incorporated within the power supply controller 20 as shown here. It may also be located outside the controller 20, and consist of any device that is capable of communicating with the device DR in accordance with the USB power delivery standard, for example a microprocessor.

The first circuit MCEP includes a reversible switched-mode power supply 10 regulating loop model BR including modifiable parameters PARAM, a storage medium STO that is configured to store, for each type of regulation, a set of reference parameters PR, and a substitution circuit MS (e.g. implemented by a processor) that is configured to modify the parameters of the model BR according to the type of regulation implemented in the reversible switched-mode power supply 10.

The reversible switched-mode power supply 10 regulating loop model BR is implemented, for example, in the form of software within a microprocessor or a microcontroller.

The reversible switched-mode power supply 10 includes three energy conversion modes: a voltage step-down (buck) operating mode, another, voltage step-up (boost) operating mode, and a voltage step-down/step-up (buck/boost) operating mode. Each operating mode may be combined with a power transfer from the terminal B102 to the terminal B101 or vice versa, and in voltage regulation mode, in current regulation mode or in combined current and voltage regulation mode.

This last combined current and voltage regulation mode makes it possible, for example, to charge a battery known to those skilled in the art as CCCV (constant current/constant voltage). The sets of parameters PR are determined by methods known to those skilled in the art.

The power supply controller 20 is, for example, constructed on the basis of a microprocessor or a microcontroller.

Figure 4:
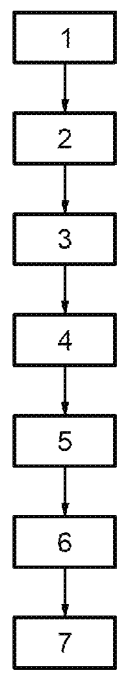

FIG. 4 illustrates a flowchart of a first exemplary implementation of the reversible switched-mode power supply 10 illustrating the various steps leading to the supply of power to the device DR operating in receiver mode at a voltage value V_BUSa by the source BATT at the voltage V_BATT via the device DS operating in source mode.

The voltage value V_BUSa is lower than the voltage value V_BATT. The value V_BUSa, for example 5 volts, is required for the device DR to operate correctly.

The value of the supply voltage from the source BATT to the terminal BBATT is equal to V_BATT, for example 15 volts. It is assumed that initially, the device DR is not linked to the device DS2. In accordance with the USB PD standard, the voltage at the terminal B101 is zero, and consequently the capacitor C11 is discharged. The transistor T5 is off, the second terminal of the capacitor C12 is not linked to ground. The value of the capacitance at the terminal VBUS1 is equal to the value of the capacitor C11, for example 10 µF, in accordance with the USB PD standard.

Since the voltage value V_BUSa is lower than the voltage value V_BATT, the reversible switched-mode power supply 10 operates here in voltage step-down (buck) mode with a power transfer from the terminal B102 to the terminal B101 by adjusting the voltage V_bus2 to the value V_BUSa and by limiting the current I_bus2 to the value I_BUSa.

In a first step 1, the device DR is linked via the cable CBL to the device DS2.

The circuit MCPD detects the presence of the device DR. During this initialization step, known to those skilled in the art as legacy mode, it is assumed that the device DS2 is operating in source mode and that the device DR is operating in receiver mode. The circuit MCEP drives the cells CEL1 to CEL4 such that the voltage V_bus2 is equal to 5 volts in accordance with the USB power delivery standard.

Next, in step 2, since the device DR supports the USB power delivery standard, the negotiation phase begins. The device DR transmits a signal S_CC2 including a request to supply power to the device DR, the supply voltage value V_BUS2 equal to the value V_BUSa and a maximum current value I_BUSa of the current I_BUS2 at the terminal to the circuit MCPD.

Next, in step 3, the circuit MCPD of the source device DS2 transmits a signal S_CC2 to the device DR, which signal includes a confirmation of implementation of the operating mode of the device DS2 in electrical power source mode, delivering a voltage value V_BUS2 that is equal to V_BUSa under a maximum current I_BUSa. The negotiation phase is complete.

In step 4, the circuit MCEP drives the transistor T5 such that it turns on. The second terminal of the capacitor C12 is thus linked to the ground GND of the reversible switched-mode power supply 10.

In step 5, the circuit MCEP drives the cells CEL1 to CEL4 such that energy is transferred from the source BATT to the device DR, i.e. from the terminal B102 to the terminal B101 at a voltage value V_bus2 that is equal to VBUSa and a current value I_bus2 that is at most equal to I_BUSa, and adjusts the parameters PARAM of the regulating loop BR of the reversible switched-mode power supply 10 according to the type of regulation by loading the corresponding stored set of parameters PR, i.e. by regulating the output voltage V_BUS2 delivered by the source BATT and monitoring the value of the current.

Stated otherwise, the circuit MCEP drives the cells CEL3 and CEL4 such that the transistor T3 is turned off and the transistor T4 is turned on in a continuous manner. The cells CEL1 and CEL2 are driven by the respective signals S_S201 and S_S202 that are in phase opposition, such that when the transistor T1 is on, the transistor T2 is off and vice versa. The signals S_S201 and S_S202 are pulse-width-modulation (PWM) signals having a variable duty cycle that is feedback-controlled by the loop BR such that the value of the voltage V_BUS2 converges towards the setpoint voltage V_BUSa. The circuit MV1 measures the value of the voltage V_BUS2. The circuit MI1 measures the value of the current I_bus2 at the terminal B101.

The voltage and the current at the terminal B101 are measured. The regulating loop BR regulates the power exchange between the first and the second terminal B101 and B102 according to the result of the measurement by adjusting, in real time, the duty cycle of the signals S_S201 and S_S202.

The circuits MI2 and MV2 measure the current and the voltage, respectively, at the terminal BBATT such that the circuit MCEP detects, for example, a fault in the source BATT.

If the current I_bus2 measured by the circuit MI1 is higher than the current value I_BUSa, in other words if there is an overload, or if the circuit MCEP detects a fault in the reversible switched-mode power supply 10 or a fault in the source BATT, the circuit MCEP stops the regulation process so that the switched-mode power supply 10 no longer delivers any electrical power to the receiver device DR. In this case, the circuit MCEP may also send an alert to the system DS2 via an electrical signal or a data bus.

In step 6, the device DR is disconnected from the device DS2, for example the cable CBL is disconnected from the device DR. The circuit MCPD detects the disconnection of the cable CBL via the pin CC2. The circuit MCEP no longer delivers signals S_S201 and S_S202, the transistors T1 and T2 are off. The source BATT no longer supplies power to the terminal B101. The capacitors C11 and C12 are charged and produce a residual voltage at the terminal B101. In step 7, the circuit MCEP drives the cells CEL2 and CEL4 so as to discharge the capacitors C11 and C12. Of course, the capacitors C11 and C12 may be discharged until the value of the potential at the terminal B101 reaches a predefined value other than 0 volts, in particular when the device DR requests a decrease in the value of the voltage V_BUS2 to a new value of the setpoint voltage. The circuit MCEP drives the discharging of the capacitors C11 and C12 until the circuit MV1 measures that the value of the potential of the terminal B101 corresponds to the new value of the setpoint voltage.

The capacitors C11 and C12 are discharged in a fractional manner. Stated otherwise, the circuit MCEP transmits a signal S_S204 to the output S204 such that the transistor T4 is turned on and a signal S_S202 to the output S202 such that the transistor T2 is turned on. The capacitors C11 and C12 are discharged through the inductor L that is linked to the common ground GND by the transistor T2. When the transistor T2 is off, the energy stored by the inductor L is transferred to C21 and C22 through the diode D11. According to another mode of implementation, the capacitors C11 and C12 are discharged by driving the transistor T2 such that it is turned on throughout the discharge step and by driving the transistor T4 via the pulse-width-modulation (PWM) signal S_S204. Once the capacitor C12 is discharged, the circuit MCEP drives the transistor T5 such that the capacitor C12 is no longer linked to ground GND.

Since the power supply pathway ALIM is symmetrical with respect to the inductor L, those skilled in the art will be able to adjust the way in which the switching cells are driven to a buck operating mode with a power transfer from the terminal B101 to the terminal B102 by regulating a current or voltage. In this operating mode of the reversible switched-mode power supply 10, the circuit MCEP drives the transistor T5 such that the capacitor C12 is linked to ground GND when the value of the voltage V_bus2 is non-zero. The energy transfer from the terminal B102 to the terminal B101 can then begin. In order to avoid high current demands when connecting the capacitor C12 to ground GND through the transistor T5, those skilled in the art will be able to adjust the control of the signal S_S205 in order to slow the closing of the transistor T5 or by adding a resistive load between D5 and S5.

Figure 5:
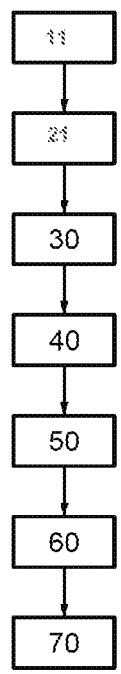

FIG. 5 illustrates a flowchart of a second exemplary implementation of the reversible switched-mode power supply 10 illustrating the various steps leading to the supply of power to the device DR operating in receiver mode at a voltage value V_BUSb by the source BATT at the voltage V_BATT via the device DS operating in source mode.

The voltage value V_BUSb is higher than the voltage value V_BATT.

The value V_BUSb, for example 20 volts, is required for the device DR to operate correctly.

The value of the supply voltage from the source BATT to the terminal BBATT is equal to V_BATT, for example 15 volts. It is assumed that the device DR is not linked to the device DS2. The transistor T5 is off, the second terminal of the capacitor C12 is not linked to ground. The value of the capacitance at the terminal Vbus2 is equal to the value of the capacitor C11, for example 10 µF, in accordance with the USB PD standard.

In this operating mode, the reversible switched-mode power supply 10 operates in voltage step-up (boost) mode with a power transfer from the terminal B102 to the terminal B101 by regulating the voltage V_bus2.

In a first step 11, the device DR is linked via the cable CBL to the device DS2.

The circuit MCPD detects the presence of the device DR.

During this initialization step, known to those skilled in the art as legacy mode, it is assumed that the device DS is operating in source mode and that the device DR is operating in receiver mode. The circuit MCEP drives the cells CEL1 to CEL4 such that the voltage V_bus2 is equal to 5 volts in accordance with the USB power delivery standard.

Next, in step 21, the negotiation phase begins. The device DR transmits a signal S_CC2 including a request to supply power to the device DR, the supply voltage value V_bus2 equal to the value V_BUSb and a maximum current value I_BUSb of the current I_bus2 at the terminal B101 to the circuit MCPD.

Next, in step 30, the circuit MCPD of the device DS2 transmits a signal S_CC2 to the device DR, which signal includes a confirmation of implementation of the operating mode of the device DS2 in electrical power source mode, delivering a voltage value V_bus2 that is equal to V_BUSb under a maximum current I_BUSb. The negotiation phase is complete.

In step 40, the circuit MCEP drives the transistor T5 such that it turns on. The second terminal of the capacitor C12 is linked to ground GND.

In step 5o, the circuit MCEP drives the cells CEL1 to CEL4 such that energy is transferred from the source BATT to the device DR, i.e. from the terminal B102 to the terminal B101 at a voltage value V_bus2 that is equal to VBUSb and a current value I_bus2 that is at most equal to I_BUSb, and adjusts the parameters PARAM of the regulating loop BR of the reversible switched-mode power supply 10 according to the type of regulation by loading the corresponding stored set of parameters PR, i.e. an operating mode regulating the output voltage V_bus2 delivered by the source BATT and monitoring the value of the current.

Stated otherwise, the circuit MCEP drives the cell CEL1 such that the transistor T1 is turned on in a continuous manner and the cell CEL2 such that the transistor T2 is turned off. The cells CEL3 and CEL4 are driven by the respective signals S_S203 and S_S204 in phase opposition, such that when T3 is on, T4 is off and vice versa. The signals S_S203 and S_S204 are pulse-width-modulation (PWM) signals having a variable duty cycle that is feedback-controlled by the loop BR such that the value of the voltage V_bus2 converges towards the setpoint voltage V_BUSb. The circuit MV1 measures the value of the voltage V_bus2. The circuit MI1 measures the value of the current I_bus2 at the terminal B101.

The voltage and the current at the terminal B101 are measured. The regulating loop BR regulates the power exchange between the first and the second terminals B101 and B102 according to the result of the measurement by adjusting, in real time, the duty cycle of the signals S_S203 and S_S204.

As described above, the circuits MI2 and EMV2 measure the current and the voltage, respectively, at the terminal BBATT such that the circuit MCEP detects, for example, a fault in the source BATT.

If the current I_bus2 measured by the circuit MI1 is higher than the current value corresponding to the current value I_BUSb, or if the circuit MCEP detects a fault in the reversible switched-mode power supply 10 or a fault in the source BATT, the circuit MCEP stops the regulation process so that the reversible switched-mode power supply 10 no longer delivers any electrical power to the receiver device DR. In this case, the circuit MCEP may also send an alert to the system DS2 via an electrical signal or a data bus.

In step 60, the device DR is disconnected, for example the cable CBL is disconnected from the receiver device DR, the circuit MCPD detects the disconnection via CC2. The circuit MCEP no longer delivers signals S_S203 and S_S204, the transistors T3 and T4 are off. The source BATT no longer supplies power to the terminal B101. The capacitors C11 and C12 are charged and produce a residual voltage at the terminal B101. In step 70, which is identical to step 7 described above, the capacitors C11 and C12 are discharged according to the discharge method described in step 7.

Since the power supply pathway ALIM is symmetrical with respect to the inductor L, those skilled in the art will be able to adjust the way in which the switching cells are driven to a boost operating mode with a power transfer from the terminal B101 to the terminal B102 by regulating a current or voltage. In this operating mode of the reversible switched-mode power supply 10, the circuit MCEP drives the transistor T5 such that the capacitor C12 is linked to ground GND when the value of the voltage V_bus2 is non-zero. The energy transfer from the terminal B102 to the terminal B101 can then begin. In order to avoid high current demands when connecting the capacitor C12 to ground GND through the transistor T5, those skilled in the art will be able to adjust the control of the signal S_S205 in order to slow the closing of the transistor T5 or by adding a resistive load between D5 and S5.

Figure 6:
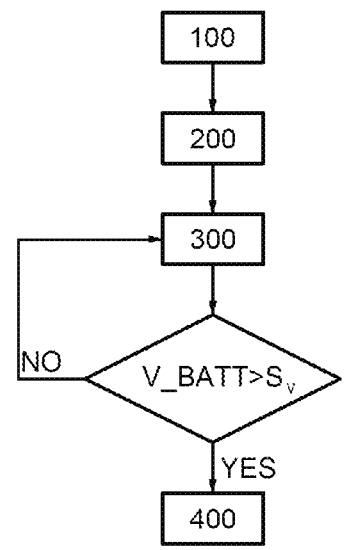

FIG. 6 illustrates a flowchart of a third exemplary implementation of the reversible switched-mode power supply 10 illustrating the various steps leading to the charging of the source BATT at the voltage V_BATT via a device DR at a voltage value V_BUSc.

The source BATT includes, for example, a lithium-ion (Li-ion) battery and the device DR includes, for example, a power bank having nominal voltage of 20 volts.

In this battery BATT-charging operating mode, the device DR operates in DC voltage source mode and the device DS2 operates in receiver mode.

The voltage value V_BUSc is higher than the voltage value V_BATT.

The devices DS2 and DR are connected to one another via the cable CBL, and consequently the capacitor C12 is linked to ground GND via the transistor T5.

It is assumed that the value of the potential of the terminal B101 is equal to V_BUSc and that the battery BATT is nearly empty, the voltage V_BATT is substantially lower than V_BUSc. For example, the nominal voltage V_BATT of the battery BATT is equal to 12 volts and the voltage V_BUSc is, for example, equal to 20 volts.

This operating mode includes the reversible switched-mode power supply 10 operating in voltage step-down (buck) mode with current and voltage regulation.

Since the battery BATT is discharged, BATT is charged in two recharging phases.

In a first recharging phase, while the value of the voltage V_BATT is lower than the charging voltage setpoint Sv, for example 17 V in the case of a Li-ion battery including three cells in series, the reversible switched-mode power supply 10 regulates the value of the current I_BATT for charging the battery such that I_BATT converges towards the charging current setpoint SI.

In a second recharging phase, as soon as the voltage V_BATT is equal to the charging voltage setpoint Sv, the reversible switched-mode power supply 10 regulates the value of the voltage at the terminal B102 such that the value of V_BATT is equal to 17 volts in this instance.

The recharging procedure will now be described.

In a first step 100, the negotiation phase begins. The circuit MCPD transmits a signal S_CC2 including a request to supply power to the device DS2, the supply voltage value V_bus2 equal to the value V_BUSc and a maximum current value I_BUSc of the current I_bus2 at the terminal B101.

Next, in step 200, the device DR transmits a signal S_CC2 to the circuit MCPD, which signal includes a confirmation of implementation of the operating mode of the device DR in electrical power source mode, delivering a voltage value V_bus2 that is equal to V_BUSc under a maximum current I_BUSc. The negotiation phase is complete.

In step 300, the value of the voltage V_BATT is lower than the threshold Sv. The circuit MCEP drives the cells CEL1 to CEL4 such that energy is transferred from the device DR to the source BATT, i.e. from the terminal B101 to the terminal B102, and adjusts the parameters PARAM of the regulating loop BR of the reversible switched-mode power supply 10 according to the type of regulation by loading the corresponding stored set of parameters PR, i.e. a mode of charging the battery by regulating the charging current I_BATT or the charging voltage V_BATT, also known as constant current/constant voltage.

In this step, the reversible switched-mode power supply 10 regulates the charging current I_BATT of the battery BATT such that I_BATT converges towards the charging current setpoint SI. The value of the current I_BATT is measured by the circuit MI2. The reversible switched-mode power supply 10 measures the current I_bus2 by the circuit MI1 so that it does not exceed the setpoint value I_BUSc of the input current I_bus2 negotiated in step 100.

If the current I_bus2 exceeds the setpoint value I_BUSc, the value of the charging current I_BATT is reduced by decreasing the charging current setpoint SI.

Stated otherwise, the circuit MCEP drives the cell CEL2 such that T2 is turned off and the cell CEL1 such that the transistor T1 is turned on in a continuous manner. The cells CEL3 and CEL4 are driven by the respective signals S_S203 and S_S204 in phase opposition, such that when the transistor T4 is on, the transistor T3 is off and vice versa. The signals S_S203 and S_S204 are pulse-width-modulation (PWM) signals having a variable duty cycle that is feedback-controlled by the loop BR such that the value of the current I_BATT converges towards the charging current setpoint SI. The circuit MI2 measures the value of the current at the terminal B102.

As soon as the voltage V_BATT is equal to the charging voltage setpoint Sv, in step 400, the reversible switched-mode power supply 10 regulates the value of the voltage V_BATT.

In steps 300 and 400, the circuits MI1 and EMV1 measure the current and the voltage of the device DR in order to detect a malfunction or an overload, for example a voltage drop and/or a current spike.

If a malfunction is detected, the circuit MCEP stops the regulation process so that the switched-mode power supply 10 no longer delivers any electrical power to the battery BATT. In this case, the circuit MCEP may also send an alert to the system DS2 via an electrical signal or a data bus.

If an overload is detected, the circuit MCEP decreases the value of the charging current setpoint SI. The charging current I_BATT is decreased, leading to a decrease in the charging power and hence in the value of the current I_bus2. Stated otherwise, the voltage and the current across the terminals B101 and B102 is measured, and the exchange of power between the first and second terminals B101 and B102 is regulated according to the result of the measurement.

Since the power supply pathway ALIM is symmetrical with respect to the inductor L, those skilled in the art will be able to adjust the way in which the switching cells are driven to an operating mode for charging a battery including a device to be charged that is linked to the terminal B101 and a source device that is linked to the terminal B102, the power supply voltage of the source device being lower than or higher than the nominal voltage of the device to be charged.

Of course, the circuit MCEP may dictate the operating mode of the reversible switched-mode power supply 10, i.e. despite the negotiation phase between the devices DR and DS2, the circuit MCEP may configure the reversible switched-mode power supply to operate in buck mode or in boost mode.

In the electrical energy transfer management methods described above, electrical power is transferred between a first terminal B101 of a USB C DRP DS2 device, which terminal is connected to a USB C DRP DR device, and a second terminal B102 of the USB C source device, which terminal is connected to a rechargeable DC voltage power source BATT, in which the power is transferred between the two terminals in one direction or the other using one and the same channel, in this instance the power supply pathway ALIM.

A device may include multiple reversible switched-mode power supplies, each reversible switched-mode power supply possibly being driven independently of the others and operating in different modes.

Advantageously, the transfer of the electrical power is regulated according to a type chosen from current and/or voltage regulation and parameters of a regulating loop of the reversible switched-mode power supply are adjusted according to the type of regulation.

According to another application, a USB DRP Type-C distributor device operating in source mode may supply power to various USB DRP Type-C devices. The device DS3 is a USB hub in this instance.

Figure 7:
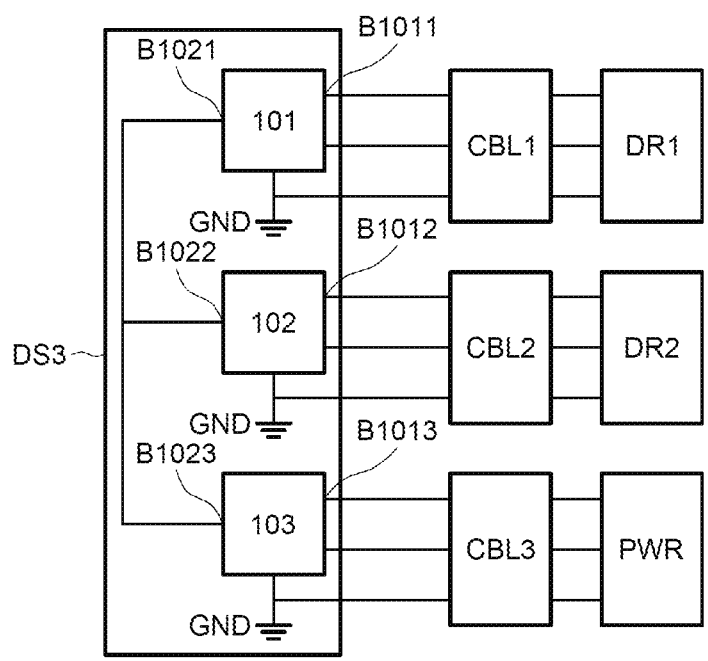

Reference is made to FIG. 7, which shows the device DS3 connected to a power source PWR, for example a USB Type-C wall-mounted charger, and to USB Type-C devices DR1 and DR2 operating in receiver mode.

The device DS3 includes switched-mode power supplies 101, 102 and 103, which are identical in make-up to the power supply 10.

The switched-mode power supplies 101, 102 and 103 each include a first terminal B1011, B1012, B1013 and a second terminal B1021, B1022 and B1023, respectively.

The terminal B1013 is linked to the source PWR. The terminal B1023 is linked to the terminals B1022 and B1021.

The switched-mode power supply 103 is supplied with power by the source PWR via the cable CBL3 and supplies power to the switched-mode power supplies 101 and 102.

The switched-mode power supplies 101 and 102 supply power to the devices DR1 and DR2 via the cables CBL1 and CBL2, respectively.

The switched-mode power supplies 101, 102 and 103 operate independently of one another.

What is claimed is:

1. A USB Type-C device supporting a bidirectional power supply, the device comprising:
   a first device terminal configured to be coupled to a second USB Type-C device;
   a second device terminal configured to be coupled to a rechargeable DC voltage power source; and a reversible switched-mode power supply coupled to the first device terminal and the second device terminal, wherein the reversible switched-mode power supply comprises a capacitor, wherein a first terminal of the capacitor is linked to the first device terminal, and wherein a second terminal of the capacitor is linked to a switch that is configured to couple the second terminal of the capacitor to a common ground of the reversible switched-mode power supply.

2. The device according to claim 1, wherein the reversible switched-mode power supply is coupled between the first device terminal and the second device terminal.

3. The device according to claim 1, wherein the reversible switched-mode power supply comprises a voltage step-up switched-mode power supply.

4. The device according to claim 1, wherein the reversible switched-mode power supply comprises a voltage step-down switched-mode power supply.

5. The device according to claim 1, wherein the reversible switched-mode power supply comprises an inductor and a plurality of switching cells, wherein the plurality of switching cells are spatially arranged symmetrically with respect to the inductor.

6. The device according to claim 5, wherein the plurality of switching cells comprises four switching cells.

7. A USB Type-C device supporting a bidirectional power supply, the device comprising:
a first device terminal configured to be coupled to a second USB Type-C device;
a second device terminal configured to be coupled to a rechargeable DC voltage power source; and
a reversible switched-mode power supply coupled to the first device terminal and the second device terminal, wherein the reversible switched-mode power supply comprises:
a first voltage measurement circuit configured to measure a voltage at the first device terminal and a second voltage measurement circuit configured to measure a voltage at the second device terminal;
a first current measurement circuit configured to measure a current at the first device terminal and a second current measurement circuit configured to measure a current at the second device terminal; and
a first regulation circuit configured to regulate an exchange of power between the first device terminal and the second device terminal according to results delivered by the first and the second voltage measurement circuits and the first and the second current measurement circuits.

8. The device according to claim 7, wherein the first regulation circuit is further configured to detect a malfunction comprising at least one of an overvoltage, an undervoltage, an overload, or a short circuit according to the results delivered by the first and the second voltage measurement circuits and the first and the second current measurement circuits.

9. The device according to claim 7, wherein the first regulation circuit is configured to carry out a type of regulation comprising at least one of a current regulation or a voltage regulation.

10. The device according to claim 9, wherein the first regulation circuit comprises:
a reversible switched-mode power supply regulating loop model comprising modifiable parameters;
a storage medium configured to store, for each type of regulation, a set of reference parameters; and
a substitution circuit configured to modify the modifiable parameters of the model according to the type of regulation implemented in the reversible switched-mode power supply.

11. A USB Type-C distributor device supporting a bidirectional power supply incorporating at least two USB Type-C devices supporting a bidirectional power supply, wherein each of the at least two USB Type-C devices comprises a first device terminal configured to be coupled to a second USB Type-C device, a second device terminal configured to be coupled to a rechargeable DC voltage power source, and a reversible switched-mode power supply coupled to the first device terminal and the second device terminal, wherein
a first terminal of a first device is configured to be coupled to a power source, a second terminal of the first device is configured to be coupled to a first terminal of a second device and a second terminal of the second device is configured to be coupled to a USB Type-C device supporting a bidirectional power supply.

12. The distributor device according to claim 11, wherein the reversible switched-mode power supply comprises a voltage step-up switched-mode power supply.

13. The distributor device according to claim 11, wherein the reversible switched-mode power supply comprises a voltage step-down switched-mode power supply.

14. The distributor device according to claim 11, wherein the reversible switched-mode power supply comprises an inductor and a plurality of switching cells, wherein the plurality of switching cells are spatially arranged symmetrically with respect to the inductor.

15. A method for managing a transfer of electrical energy between a first device terminal of a first USB Type-C device supporting a bidirectional power supply and a second device terminal of the first USB Type-C device supporting the bidirectional power supply, the method comprising:
coupling the first device terminal of the first USB Type-C device to a second USB Type-C device supporting the bidirectional power supply;
coupling the second device terminal of the first USB Type-C device to a rechargeable DC voltage power source; and
transferring electrical energy between the first device terminal and the second device terminal in one direction or the other using one and the same channel.

16. The method according to claim 15, further comprising measuring a voltage and a current across the first device terminal and the second device terminal, and regulating an exchange of energy between the first device terminal and the second device terminal according to a result of the measurement.

17. The method according to claim 16, further comprising detecting at least one of an overvoltage, an undervoltage, an overload, or a short circuit according to the result of the measurement.

18. The method according to claim 16, wherein regulating the exchange of energy comprises a type chosen from at least one of a current regulation or a voltage regulation.

19. The method according to claim 18, wherein parameters of a reversible switched-mode power supply regulating loop are adjusted according to the type of regulation.

* * * * *